United States Patent [19]

Han

[11] Patent Number: 4,872,527

[45] Date of Patent: Oct. 10, 1989

[54] SPEAKER SYSTEM

[75] Inventor: Bong H. Han, Suwon, Rep. of Korea

[73] Assignee: Samsung Electronics Co., Ltd., Suwon, Rep. of Korea

[21] Appl. No.: 198,876

[22] Filed: May 27, 1988

[30] Foreign Application Priority Data

May 30, 1987 [KR] Rep. of Korea .................. 1987-8660

[51] Int. Cl.[4] .................................................. H05K 5/00

[52] U.S. Cl. ..................................... 181/160; 181/148; 181/156; 181/199; 361/159

[58] Field of Search ............... 181/148, 152, 156, 160, 181/199; 381/90, 158, 159

[56] References Cited

U.S. PATENT DOCUMENTS

| | | | |
|---|---|---|---|
| 2,062,478 | 12/1936 | Riesz | 181/198 |
| 2,205,804 | 6/1940 | Wells | 181/155 |
| 3,055,451 | 9/1962 | Kenney | 181/156 |
| 3,327,808 | 6/1967 | Shaper | 181/156 X |
| 4,482,026 | 11/1984 | Stehlin, Jr. | 181/152 |
| 4,549,631 | 10/1985 | Bose | 181/155 |

FOREIGN PATENT DOCUMENTS

| | | | |
|---|---|---|---|
| 563658 | 1/1957 | Italy | 181/160 |

*Primary Examiner*—B. R. Fuller

*Attorney, Agent, or Firm*—Saidman, Sterne, Kessler & Goldstein

[57] ABSTRACT

A speaker system especially designed to improve the characteristics of low sound bands. The speaker system desirably includes a partition dividing the interior of a cabinet into a speaker chamber and a resonance chamber, and two radiation ports. One radiation port is formed on the partition and the other one on the walls of the resonance chamber which do not face each other.

6 Claims, 3 Drawing Sheets

PRIOR ART

SPEAKER SYSTEM

BACKGROUND OF THE INVENTION

1. Field of the Invention

The present invention relates to a speaker system for improving the characteristics of the sound wave of a certain band.

2. Description of the Prior Arts

Conventionally, speaker systems having structures such as those shown in FIGS. 5A–5C are widely used. These conventional speaker systems, however, have disadvantages such as difficulties in manufacture, poor tone quality and the like.

For example, FIG. 5A shows a typical bass reflex speaker system which employs the interference (or increase) phenomenon of the sound waves inside and outside of the cabinet according to the size and length of the duct D. However, this type of speaker system is difficult to manufacture as it requires a cabinet of a strength above a certain level. Moreover, the use of this speaker system is generally limited to the reproduction of a sound wave lower than the minimum resonance frequency thereof.

FIG. 5B shows a popular-priced type speaker system usually adopted in a radio receiver or a television set. This speaker system also has the problems of poor performance at low sound bands and the occurance of a split phenomenon at high sound bands.

In speaker systems having a sealed cabinet (shown in FIG. 5C), the cabinet must be strong enough that any resonance due to vibration of the speaker can be prevented. Also, if the cabinet is not sealed completely, the tone quality will deteriorate. Therefore, speaker systems of this type also present many difficulties in manufacturing.

Consequently, conventional speaker systems having a desirable tone quality are difficult to manufacture. Also, as they are designed to radiate sounds in one certain direction, it is insufficient to improve the sound field of a required certain band.

SUMMARY OF THE INVENTION

It is an object of the present invention to provide a speaker system which improves the sound fields of a certain band in both directions.

The above object is inventively achieved by dividing the interior of the cabinet into two chambers and placing the speaker in one of the chambers and employing the other as a resonance chamber.

BRIEF DESCRIPTION OF THE DRAWINGS

The present invention will now be described by way of illustrative example with reference to the accompanying drawings, in which.

DESCRIPTION OF THE PREFERRED EMBODIMENTS

Figure 1:
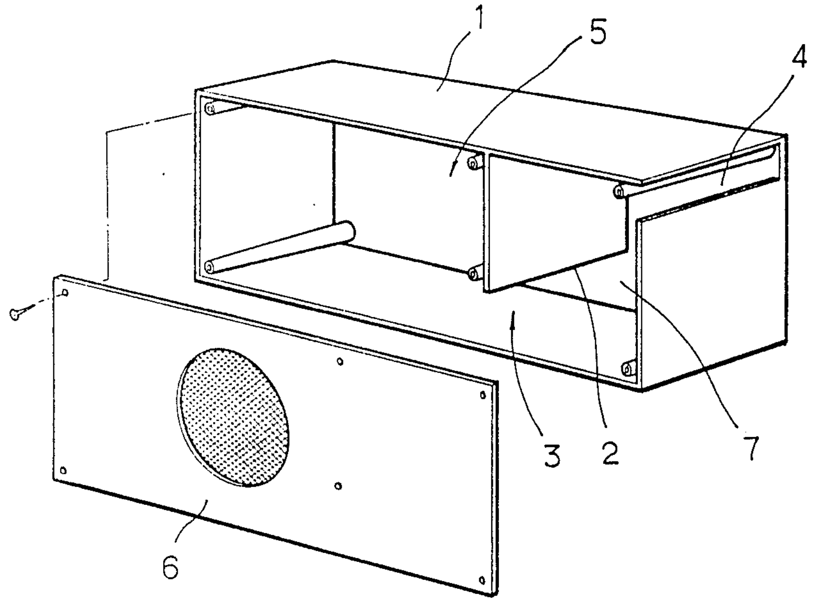
FIG. 1 is an exploded perspective view of a preferred embodiment of a speaker system according to the present invention.
Figure 3:
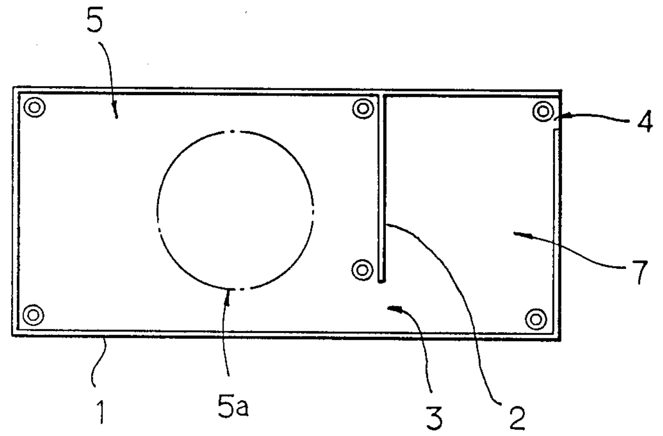
FIG. 3 is an elevation of the embodiment of FIG. 1.

In a preferred embodiment of the present invention (FIGS. 1,3), the interior of a cabinet 1 is divided into a speaker chamber 5 and a resonance chamber 7 by a partition 2. One radiation port 3 is formed beneath the partition 2, another radiation port 4 is formed on the upper part of a side wall of the resonance chamber 7 facing the partition 2, and the speaker 5*a* is mounted between the speaker chamber 5 and the baffle 6.

When the speaker 5*a*, referred to in the present invention as described above, is operating, the sound waves produced by the vibrating plate of the speaker are radiated to the front and rear space of the speaker 5*a* with the equal intensity. At this instant, the sound wave radiated to the rear space of the speaker 5*a* passes through one radiation port 3, the resonance chamber 7 of the cabinet 1, and then is radiated to the exterior of the cabinet 1 through the other radiation port 4. The size of the partition 2 and the area of one radiation port 3 are set so that the upper limit frequency of the sound wave is reproduced. The volume of the resonance chamber 7 and the area of the other radiation port 4 are suitably set in accordance with the lower limit frequency of the sound wave to be reproduced so that the resonance occurs at the lower limit frequency. The lowest resonance frequency of the speaker 5*a* is set between the upper limit frequency and the lower limit frequency of the sound wave to be reproduced.

In the preferred embodiment described above, one radiation port 3 is formed beneath the partition 2 and the other radiation port 4 is formed on the upper part of the side wall of the resonance chamber 7 facing the partition 2.

Figure 4A:
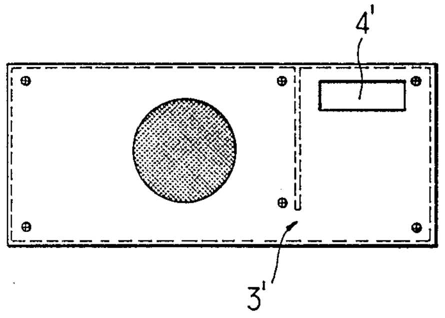
FIGS. 4A, 4B and 4C show other embodiments of the present invention.
Figure 4B:
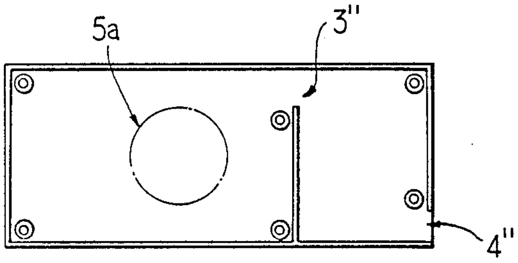
Figure 4C:
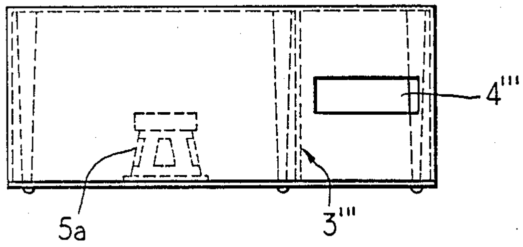
Figure 5A:
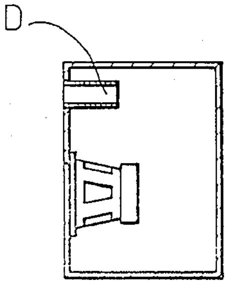
FIGS. 5A, 5B and 5C are side views, partly in cross-section, of conventional speaker systems.
Figure 5B:
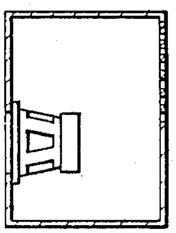
PRIOR ART FIG.5 B
Figure 5C:
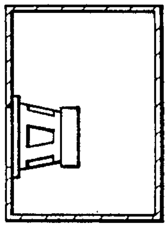
PRIOR ART FIG.5 C

Referring to FIGS. 4A, 4B and 4C, there are shown other embodiments of the present invention. In these embodiments, various radiation ports 3′, 3″, 3‴, 4′, 4″, 4‴ are formed so that the resonance properly occurs in the resonance chamber 7.

Figure 2:
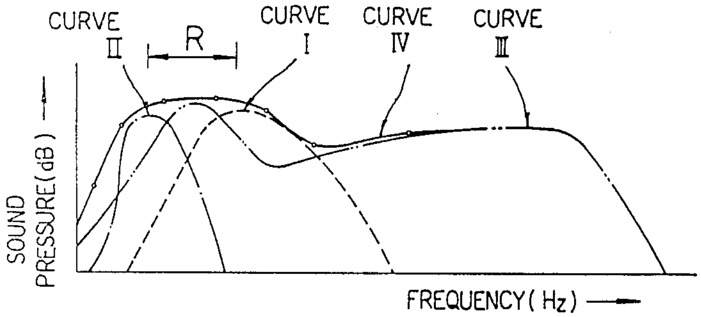
FIG. 2 shows the characteristics of the sound field of the speaker system according to the present invention.

FIG. 2 shows the relationship between the frequency characteristics of two radiation ports 3, 4 and the lowest resonance frequency of the speaker 5a. Curve I shows the frequency characteristic of the other radiation port, Curve II shows that of one radiation port, Curve III shows that of the lowest resonance band of the speaker 5*a*, and Curve IV shows the overall frequency characteristic respectively. The character R indicates the frequency range required to be reproduced.

From the foregoing it will be apparent that the present invention provides the advantage of improving the characteristics of low sound bands, since the sound radiated to the rear passes the bass reflex and resonance structures and the lowest resonance frequency of the speaker is properly set between the upper and lower limit frequencies of the sound to be reporduced.

Whereas the present invention has been described in particular relation to the drawings attached hereto, it should be understood that other and further modifications, apart from those shown or suggested herein may be made within the spirit and scope of this invention.

What is claimed is:

1. A speaker system comprising:

a partition of predetermined size dividing an interior of a cabinet into a speaker chamber, and a resonance chamber of a predetermined volume;

said speaker chamber including at least one speaker;

said partition including a first radiation port of predetermined area for passing reproduced sound waves; and a second radiation port of predetermined area formed in a wall of the resonance chamber which does not face said first radiation port;

wherein the size of said partition and the area of said first radiation port are set in accordance with an upper limit frequency of said reproduced sound waves, and the volume of said resonance chamber and the area of said second radiation port are set in accordance with a lower limit frequency of said reproduced sound waves.

2. A speaker system as claimed in claim 1, wherein: said first radiation port is formed on a lower part of said partition or between said partition and a bottom wall, and said second radiation port is formed on an upper part of a side wall of said resonance chamber.

3. A speaker system as claimed in claim 1, wherein: said first radiation port is formed on an upper part of said partition or between said partition and a top wall, and said second radiation port is formed on a lower part of a side wall of said resonance chamber.

4. A speaker system as claimed in claim 1, wherein: said first radiation port is formed on a lower part of said partition or between said partition and a bottom wall, and said second radiation port is formed on an upper part of a front wall of said resonance chamber.

5. A speaker system as claimed in claim 1, wherein: said first radiation port is formed on a lower part of said partition or between said partition and a bottom wall, and said second radiation port is formed on an upper part of a rear wall of said resonance chamber.

6. A speaker system as claimed in claim 1, wherein: said first radiation port is formed on a lower part of said partition or between said partition and a bottom wall, and said second radiation port is formed on a top wall of said resonance chamber.

* * * * *